Jan. 28, 1964 G. B. THOMPSON ET AL 3,119,970

VARIABLE GAIN AMPLIFIERS

Filed March 7, 1960 2 Sheets-Sheet 1

Inventors
GORDON B. THOMPSON
DAVID G. VICE
By Robert S. Harmon
Attorney

Jan. 28, 1964 G. B. THOMPSON ET AL 3,119,970

VARIABLE GAIN AMPLIFIERS

Filed March 7, 1960 2 Sheets-Sheet 2

Inventors
GORDON B. THOMPSON
DAVID G. VICE

By Robert B. Harmon
Attorneys

United States Patent Office 3,119,970

Patented Jan. 28, 1964

3,119,970

VARIABLE GAIN AMPLIFIERS

Gordon B. Thompson and David G. Vice, Belleville, Ontario, Canada, assignors to Northern Electric Company, Limited, Montreal, Quebec, Canada, a corporation of Canada Filed Mar. 7, 1960, Ser. No. 13,257
4 Claims. (Cl. 330—123)

Figure 1:
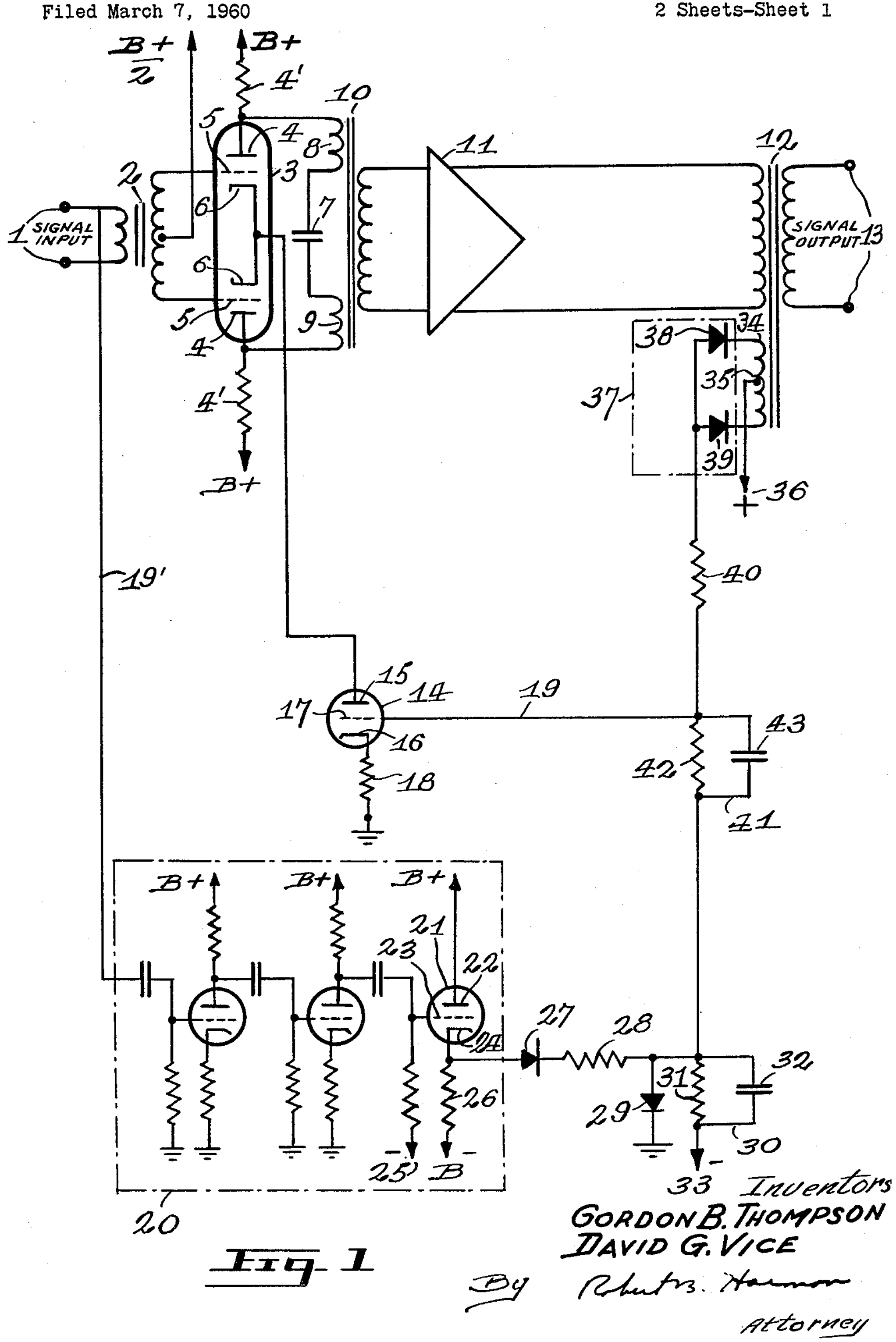

This invention relates to variable gain amplifiers and more particularly to variable gain amplifiers having means to automatically vary their gain in accordance with variations in the strength of the applied energy.

In broadcast studio, telephone and public address systems, variable gain amplifiers are commonly used to reduce the maximum excursions of the signal material being handled. In the compression type amplifier, the wide dynamic range of signal levels is reduced to a more conveniently handled range and in the expander type amplifier the low signal levels are raised to produce a better signal to noise ratio.

Prior art variable gain amplifiers that utilize both compression and expansion of signal have no linear input-output response characteristic in the useful signal level range. The direct transition from expansion of signal to compression of signal without an intermediate linear range can produce serious distortion of signal in the intermediate dynamic range.

In addition prior art amplifiers produce spurious signals at their output due to gain change in the amplifier. These signals may be audible or they may cause instability in the amplifier.

Another difficulty encountered in the prior art is that the variable gain stages tend to operate on large gain control potentials which require high power sources for these potentials.

The undesirable effect commonly known as "noise pumping" is also inherent to many of the prior art amplifiers. During no signal periods this effect causes input noise to become audible which can be very objectionable to the listener when a high degree of compression is used to mask input noise.

Accordingly it is a primary object of this invention to provide a high performance variable gain amplifier in which no extraneous effects due to the compression action of the amplifier is produced.

Another important object of this invention is to provide a variable gain amplifier which limits the amount of expansion such that the amplifier operates as a linear device for intermediate signals between expansion and compression. This makes possible a subjectively measured signal to noise improvement without any distortion of dynamic range of signal between expansion limit and compression threshold.

Another object of this invention is to provide a variable gain stage which reduces the spurious signals at the output of the amplifier due to gain change to a negligible amount.

Another object of this invention is to provide a variable gain amplifier which includes a new variable gain stage which allows a considerable reduction of power and components required.

Yet another object of this invention is to provide a direct current control amplifier in the common cathode circuit of the variable gain stage, allowing a wide range of gain control with small changes of direct current potential.

A further object of this invention is to provide a novel means of obtaining a subjectively measured signal to noise improvement at the output of an amplifier under compression.

A further object of this invention is to provide a variable gain amplifier which eliminates the "noise pumping" disadvantage of compression operation.

Still a further object of this invention is to provide a variable gain amplifier having a linear but reduced gain characteristic at signal levels below noise, an expansion characteristic at low signal levels above noise, a compression characteristic at high signal levels and a linear characteristic representing maximum gain between expansion and compression signal levels.

These and other objects of this invention are attained in one embodiment by providing an amplifier having its gain varied by control elements consisting of:

An expander circuit adapted to reduce the gain of the amplifier for input signal levels below a given threshold of expansion potential, to increase the gain of the amplifier for input signal levels greater than the threshold of expansion potential and to maintain a constant gain for input signal levels greater than the limit of expansion potential, a compression circuit adapted to reduce the gain of the amplifier for input signal levels above a threshold of compression potential.

Figure 2:
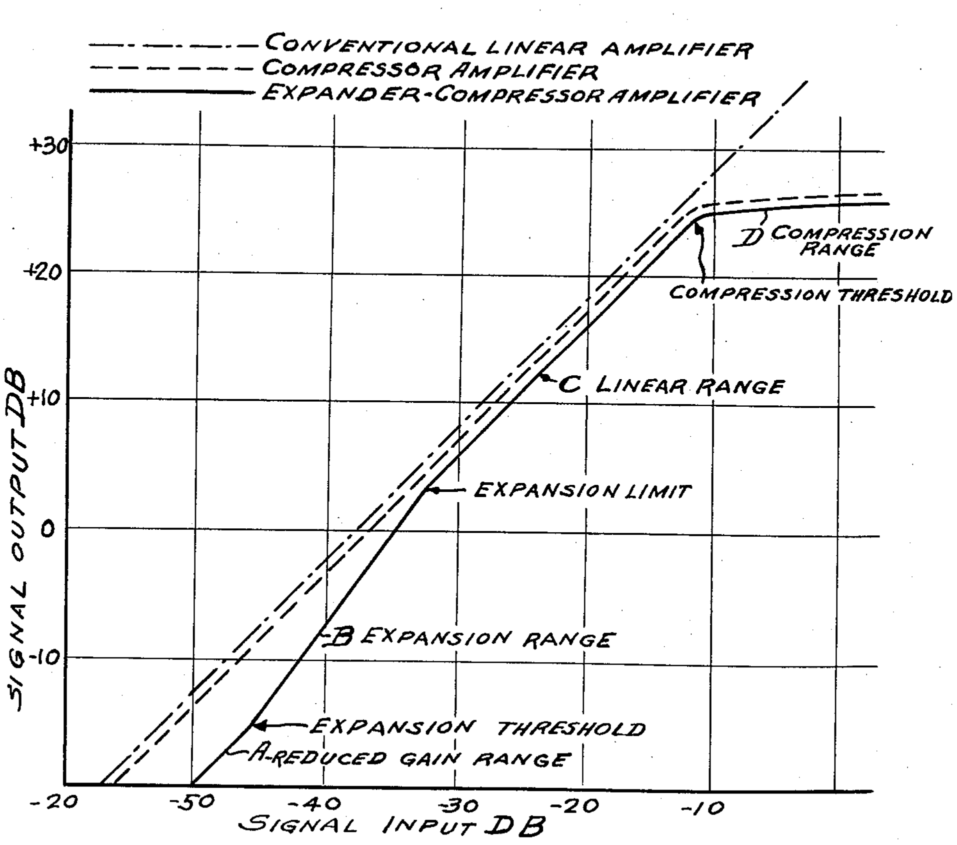

Other objects and advantages of our invention will become apparent in the following detailed description when read in view of the accompanying drawings in which:

FIG. 1 is a circuit of an amplifier embodying the principles of the invention; and FIG. 2 is a graph showing typical input-output response characteristics of the amplifier as compared to conventional linear amplifiers and compressor amplifiers.

Referring to the drawings, in FIG. 1 there is shown a signal input 1 connected through a transformer 2 to a push pull variable gain stage consisting of a duo-triode 3 of the semi-remote cut-off variable transconductance type, having anodes, control grids and cathodes 4, 5 and 6 respectively, the cathodes 6 being connected together, the anodes 4 connected to one end and capacitor 7 connected to the other end of primary sections 8 and 9 of transformer 10. The anodes 4 are connected through resistors 4' to supply potential B+. Transformer 10 is connected through amplifier 11, which may be of any conventional type, and transformer 12 to the signal output 13.

Also shown in FIG. 1 is a gain control stage consisting of triode tube 14 of the semi-remote cut-off variable transconductance type having anode, cathode and control grid 15, 16 and 17 respectively, the anode 15 being connected to the cathodes 6 of tube 3, the cathode 16 being connected through a small resistor 18 to ground and the grid 17 being connected through conductor 19 to the direct current potential which controls the gain of the amplifier.

Also shown in FIG. 1 is an expander circuit. Connected from the signal input 1 through conductor 19' is a conventional three stage single ended resistance coupled amplifier 20 called the expansion control amplifier having a cathode follower output, with output tube 21 having an anode, control grid and cathode, 22, 23 and 24 respectively. The grid 23 is referenced to a predetermined direct current negative potential 25 called the expansion threshold and the cathode 24 is connected through its load resistor 26 to a negative direct current potential. The output of tube 21 is connected from its cathode 24 to an expansion diode rectifier 27 which is serially connected for positive output polarity through resistor 28 to expansion limiting diode 29, and to expansion filter 30, diode 29 being connected in its forward direction to ground, filter 30 consisting of a resistor 31 shunted by capacitor 32 having a time constant of approximately one-half second and being connected to a predetermined direct current negative potential 33 called the expansion reference and to a compression filter 41 of a compressor circuit. The charging time constant of filter 30 through diode 27 and resistor 28 can be several milliseconds.

In addition there is shown in FIG. 1 a compressor circuit. The output transformer 12 has a center tapped tertiary winding 34 whose number of turns are determined by the output level to the load desired, such that approximately 50 volts peak to peak signal appears across this winding at full output. The center tap 35 is connected to a predetermined positive potential 36 called the compression threshold. A full-wave compression rectifier 37 consisting of diodes 38 and 39 is connected in a push pull arrangement for negative output polarity from the tertiary winding 34 through resistor 40 to the compression filter 41, consisting of a resistor 42 shunted by capacitor 43 and having a time constant of approximately one-half second. The charging time constant of the filter 41, through rectifier 37 and resistor 40 should be very short, say approximately 100 microseconds. The rectified voltage appearing at the filter 41 is serially connected through conductor 19 to the grid 17 of gain control tube 14.

The actual time constant of filters 30 and 41 and the values of resistors 28 and 40 can be selected for the type of operation required.

Before the operation of the circuit of this invention, the expansion threshold potential 25, the expansion reference potential 33 and the compression threshold potential 36 serve as biasing means and are adjusted so that the expansion rectifier 27, the limiting diode 29 and the compression rectifier 37 are non-conducting for predetermined signal potentials applied thereto, these reference potentials being chosen to suit the desired operation of the amplifier. The expansion threshold potential can be slightly above noise level. The expansion reference potential can be a few volts negative to control the reduced gain range. The compression threshold is chosen for the output level or the degree of compression desired.

When a signal is applied to the input 1 of the amplifier, the signal is amplified with the output appearing at 13. The signal input 1 is also applied to the expansion control amplifier 20, the output of which is applied to the expansion rectifier 27.

While the amplifier is undergoing gain change, spurious signals appearing at the output 13 are reduced to a negligible amount by the action of interstage transformer 10 and blocking capacitor 7 which develop output for push-pull signal but develop no output for equal potentials at the anodes 4 of tube 3 caused by the change of anode current with gain, thereby preventing these equal potentials from reaching the following stages 11 and the output 13.

When no signal or a signal near noise appear at the input 1, the potential at the control grid 17 of the gain control tube 14 is substantially at the expansion reference potential 33. This is because the expansion rectifier 27, the compression rectifier 37 and the limiting diode 29 do not conduct and because the tube 14 is biased such that the grid 17 draws negligible current. The expansion reference potential 33 is chosen so that the gain of the amplifier is limited to below its maximum. For this range of input signals, the reduced gain range of the input output characteristics is illustrated in FIG. 2 as curve A.

When the signal applied to the input 1 is increased to the point at which the zero to peak potential appearing at the input to the expansion rectifier 27 exceeds the expansion reference potential 33, the expansion rectifier 27 conducts and through resistor 28, charges the capacitor 32 of expansion filter 30 positively. This raises the potential at the control grid 17 of the gain control tube 14 thus increasing the gain of the amplifier.

As the input signal is increased, the process of expanded gain continues until the level on the expansion filter 30 rises to zero volts. For this range of input signals, the expansion range of the input-output characteristics is illustrated in FIG. 2 as curve B.

As the input signal is further increased, any potentials above zero volts will be clamped to ground by the expansion limiter diode 29. The zero volt level corresponds to maximum gain of the amplifier. The gain of the amplifier will remain constant at maximum gain until the zero to peak signal appearing at the tertiary winding 34 of the output transformer 12 reaches the compression threshold potential 36. For this range of input signals, the linear range of the input-output characteristics is illustrated in FIG. 2 as curve C.

When the signal appearing at the tertiary winding 34 of the output transformer 12 exceeds the compression threshold potential 36, the compression rectifier 37 conducts and through resistor 40 charges the capacitor 43 of compression filter 41 negatively. This lowers the potential at the control grid 17 of the gain control stage 14 thereby reducing the gain of the amplifier. The compression attack time is achieved such that a 1 kc. tone burst 10 db over compression threshold potential produces no appreciable signal overshoot.

As the input signal is further increased the output of the amplifier rises only slightly, the increase in output peak being equal to the increment to the control potential required to reduce the gain in the desired compression ratio. For this range of input signals, the compression range of the input-output characteristics is illustrated in FIG. 2 as curve D.

As can be seen by the above description, this invention achieves its objectives by providing a high performance variable gain amplifier that prevents expansion during no signal periods thereby eliminating the noise pumping effect, that limits the amount of expansion and introduces a linear range of dynamic signal between expansion limit and compression threshold, thereby providing lower dynamic range distortion, that reduces transients to a negligible amount and improves stability, that provides a compressor circuit with rapid attack resulting in small output signal rise with rising input signal for levels over compression threshold and that provides a variable gain stage which can operate on small gain control potential differences thereby allowing a considerable reduction of power and components required.

What is claimed is:

1. In a variable gain amplifying circuit, in combination with a signal source, an amplifying stage which includes a first electron discharge device having at least an anode, a cathode and a control electrode, means for applying the signal source thereto between the cathode and control electrode, means for applying the output therefrom between the cathode and anode to an output circuit, means for amplifying a part of the signal source, first rectifying means connected to the output of said amplifying means, a first timing network connected to said rectifying means responsive to rectified signals therefrom, control means connected between said timing network and the electron discharge device to continuously control the gain of said device in response to the signal developed in said timing network, first biasing means to render said rectifying means non-conductive and to develop a predetermined constant signal in said timing network when the amplified part of the signal source is below a first predetermined level, whereby said device produces substantially linear gain below maximum operating gain, said biasing means rendering said rectifying means conductive when the amplified part of the signal source exceeds the first predetermined level to develop increasing signal in said timing network with increasing amplitudes of the signal source, whereby said device produces increasing gain, and limiting means connected across the junction of said rectifying means and said timing network limiting the response of said timing network to rectified signals of a second predetermined level of greater amplitude than the first predetermined level, whereby said device produces substantially linear gain at substantially maximum operating gain, a second rectifying means connected to part of the amplified signal source appearing at the output circuit, a second timing network connected between the second rectifying means and the first timing network, the second timing network being responsive to rectified signals from the second rectifying means, the control means being connected between the junction of said timing networks and the electron discharge device to further continuously control the gain of said device in response to the signal developed in the second timing network, second biasing means to render the second rectifying means non-conductive when said part of the amplified signal source appearing at the output circuit is below a third predetermined level of greater amplitude than the second predetermined level, the second biasing means rendering the second rectifying means conductive when said part of the amplified signal source appearing at the output circuit exceeds the third predetermined level to develop decreasing signal in the second timing network with increasing amplitudes of the signal source, whereby said device produces decreasing gain.

2. In a variable gain amplifying circuit in accordance with claim 1, in which said timing networks comprise first and second parallel R-C networks serially connected together between the part of the first biasing means which develops said predetermined constant signal and the second rectifying means, the first rectifying means being poled for positive output polarity conduction to increase the signal developed in the first said R-C network in a positive direction, the limiting means comprises third rectifying means poled for positive output polarity conduction from the junction of the first rectifying means and said first R-C network to a predetermined source of D.C. potential, whereby the third rectifying means is rendered non-conductive when the rectified signal from the first rectifying means is below the second predetermined level, and is rendered conductive when the rectified signal from the first rectifying means exceeds the second predetermined level to clamp further increases in the conduction of the first rectifying means to said source of D.C. potential, the second rectifying means being poled for negative output polarity conduction to develop a negative going signal in the second said R-C network, the control means comprises a second electron discharge device having an anode, cathode and control electrode, the junction of said timing networks being connected to the control electrode of said second device, the cathode of said first device being connected to the anode of said second device.

3. In a variable gain amplifying circuit in accordance with claim 1 in which the control means comprises a second electron discharge device having an anode, cathode and control electrode, the junction of said timing networks being connected to the control electrode of said second device, the cathode of said first device being connected to the anode of said second device.

4. In a variable gain amplifying circuit in accordance with claim 3 in which said amplifying stage consists of a push-pull amplifier, which includes an output transformer having a pair of primary windings, with a blocking capacitor connected therebetween, connected in the output circuit of the stage, a pair of dropping resistors, connected in series in shunt relation with the primary windings, a source of anode potential connected to the junction point of the two resistors, a secondary winding connected to a subsequent amplifying stage, means for connecting the output of the subsequent stage to the output circuit.

References Cited in the file of this patent

UNITED STATES PATENTS

| | | |
|---|---|---|
| 2,193,966 | Jones | Mar. 19, 1940 |
| 2,250,559 | Weber | July 29, 1941 |
| 2,468,205 | Kellogg | Apr. 26, 1949 |
| 2,638,501 | Coleman | May 12, 1953 |
| 2,754,482 | Percival et al. | July 10, 1956 |
| 2,760,008 | Schade | Aug. 21, 1956 |
| 2,777,018 | Russell | Jan. 8, 1957 |
| 2,852,675 | Oliver | Sept. 16, 1958 |
| 2,864,044 | Pardee | Dec. 9, 1958 |